United States Patent
Nadeau-Dostie et al.

(10) Patent No.: US 11,961,576 B2
(45) Date of Patent: Apr. 16, 2024

(54) METHOD AND APPARATUS FOR PROCESSING MEMORY REPAIR INFORMATION

(71) Applicant: Siemens Industry Software Inc, Plano, TX (US)

(72) Inventors: Benoit Nadeau-Dostie, Gatineau (CA); Luc Romain, Gatineau (CA)

(*) Notice: Subject to any disclaimer, the term of this patent is extended or adjusted under 35 U.S.C. 154(b) by 228 days.

(21) Appl. No.: 17/604,805

(22) PCT Filed: Aug. 27, 2019

(86) PCT No.: PCT/US2019/048223
§ 371 (c)(1),
(2) Date: Oct. 19, 2021

(87) PCT Pub. No.: WO2020/214195
PCT Pub. Date: Oct. 22, 2020

(65) Prior Publication Data
US 2022/0215896 A1   Jul. 7, 2022

Related U.S. Application Data

(60) Provisional application No. 62/836,100, filed on Apr. 19, 2019.

(51) Int. Cl.
*G11C 29/00* (2006.01)
*G11C 29/36* (2006.01)
(Continued)

(52) U.S. Cl.
CPC .......... *G11C 29/4401* (2013.01); *G11C 29/36* (2013.01); *G11C 29/40* (2013.01); *G11C 2029/3602* (2013.01)

(58) Field of Classification Search
CPC ..... G11C 29/4401; G11C 29/36; G11C 29/40; G11C 2029/3602
See application file for complete search history.

(56) References Cited

U.S. PATENT DOCUMENTS 6,415,403 B1* 7/2002 Huang ................ G11C 29/16
714/733
7,149,924 B1   12/2006 Zorian
(Continued)

FOREIGN PATENT DOCUMENTS

CN   101290804 B   10/2010
CN   103390430 A   11/2013
(Continued)

OTHER PUBLICATIONS

PCT International Search Report and Written Opinion of International Searching Authority dated Dec. 6, 2019 corresponding to PCT International Application No. PCT/US2019/048223 filed Aug. 27, 2019.

(Continued)

*Primary Examiner* — Min Huang

(57) ABSTRACT

Systems and methods for repairing a memory. A method includes performing a repair analysis of the embedded memories to produce repair information. The method includes storing the repair information in the registers, where the registers are organized into groups having chains of identical length. The method includes performing collision detection between the repair information in each of the groups. The method includes merging the repair information in each of the groups. The method includes repairing the embedded memories using the merged repair information.

20 Claims, 9 Drawing Sheets

(51) Int. Cl.
  *G11C 29/40*  (2006.01)
  *G11C 29/44*  (2006.01)

(56) References Cited

U.S. PATENT DOCUMENTS

| | | | |
|---|---|---|---|
| 7,415,640 | B1 | 8/2008 | Zorian |
| 7,757,135 | B2 | 7/2010 | Nadeau-Dostie et al. |
| 7,898,882 | B2 | 3/2011 | Darbinyan et al. |
| 8,295,108 | B2 | 10/2012 | Darbinyan et al. |
| 8,775,880 | B2 | 7/2014 | Singh et al. |
| 9,799,413 | B2 | 10/2017 | Gorman et al. |
| 9,852,810 | B2 | 12/2017 | Varadarajan et al. |
| 10,014,074 | B2 | 7/2018 | Mondal et al. |
| 10,134,483 | B2 | 11/2018 | Varadarajan et al. |
| 2004/0163015 | A1* | 8/2004 | Nadeau-Dostie ...... G11C 29/44 714/42 |
| 2008/0008015 | A1 | 1/2008 | Darbinyan et al. |
| 2008/0065929 | A1 | 3/2008 | Nadeau-Dostie et al. |
| 2009/0016129 | A1* | 1/2009 | Anand ................ G11C 29/802 365/200 |
| 2013/0031319 | A1 | 1/2013 | Gorman et al. |
| 2014/0029362 | A1 | 1/2014 | Adham et al. |
| 2015/0074474 | A1 | 3/2015 | Issa et al. |
| 2016/0172058 | A1 | 6/2016 | Srivastava et al. |
| 2019/0055895 | A1 | 2/2019 | Morzano |
| 2022/0005541 | A1* | 1/2022 | Johnson ................ G11C 29/44 |

FOREIGN PATENT DOCUMENTS

| | | |
|---|---|---|
| JP | 2008021359 A | 1/2008 |
| KR | 19990004552 A | 1/1999 |

OTHER PUBLICATIONS

Yi-Chun Shih et al. "Logic Process Compatible 40-nm 16-Mb, Embedded Perpendicular-MRAM With Hybrid-Resistance Reference, Sub-μA Sensing Resolution, and 17.5-nS Read Access Time", IEEE Journal of Solid-State Circuits, vol. 54, No. 4, Apr. 2019, pp. 1029-1038.

Tze-Hsin Wu et al., "A Memory Yield Improvement Scheme Combining Built-In Self-Repair and Error Correction Codes," Proc. IEEE International Test Conference 2012, paper 14.1, pp. 1-9.

Artur Antonyan et al. "Embedded MRAM Macro for eFlash Replacement", 2018 IEEE International Symposium on Circuits and Systems (ISCAS), 2018, 4 pgs.

Keiichi Kushida et al. "DFT Techniques for Memory Macro with Built-in ECC", 2005 IEEE International Workshop on Memory Technology, Design, and Testing (MTDT'05), 2005, 6 pgs.

Panagiota Papavramidou and Michael Nicolaidis, "Test Algorithms for ECC-based Memory Repair in Nanotechnologies", 2012 IEEE 30th VLSI Test Symposium (VTS), 2012, pp. 228-233.

Logicvision, "Memory Repair Primer: A Guide to Understanding Embedded Memory Repair Options and Issues", Apr. 2007, 24 pages.

V. Sridhar et al. "Built-In Self Repair (BISR) Technique Widely Used to Repair Embedded Random Access Memories (RAMs)", International Journal of Computer Science Engineering (IJCSE), Sep. 2012, vol. 1, No. 1, 19 pages.

Zhu Ping "Design and Verification of Adaptive Digital System Based on Fast Hybrid Reconfiguration," Feb. 15, 2019, Database of Full Texts of the Dissertations for Master Degree with Distinction in China (vol. II of Engineering Technology).

C. Banupriya et al., A Low Power Built in Repair Analyzer for Word Oriented Memories with Optimal Repair Rate; 2014 International Conference on Green Computing Communication and; pp. 1-5; India.

Yang Bin, et al. "Research on the Repair Technology of Embedded Memory"; Microelectronics and Computers; May 2015; pp. 05, vol. 32; issue 05; China.

V. R. Devanathan et al., "A Reconfigurable Built-in Memory Self-repair Architecture for Heterogeneous Cores with Embedded BIST Datapath"; Jan. 5, 2017; 2016 IEEE International Test Conference (ITC); pp. 1-6, USA.

Jais Abraham et al., "Adapting an Industrial Memory BIST solution for testing CAMs", pp. 112-117; Nov. 7, 2017; 2017 International Test Conference in Asia (ITC-Asia).

* cited by examiner

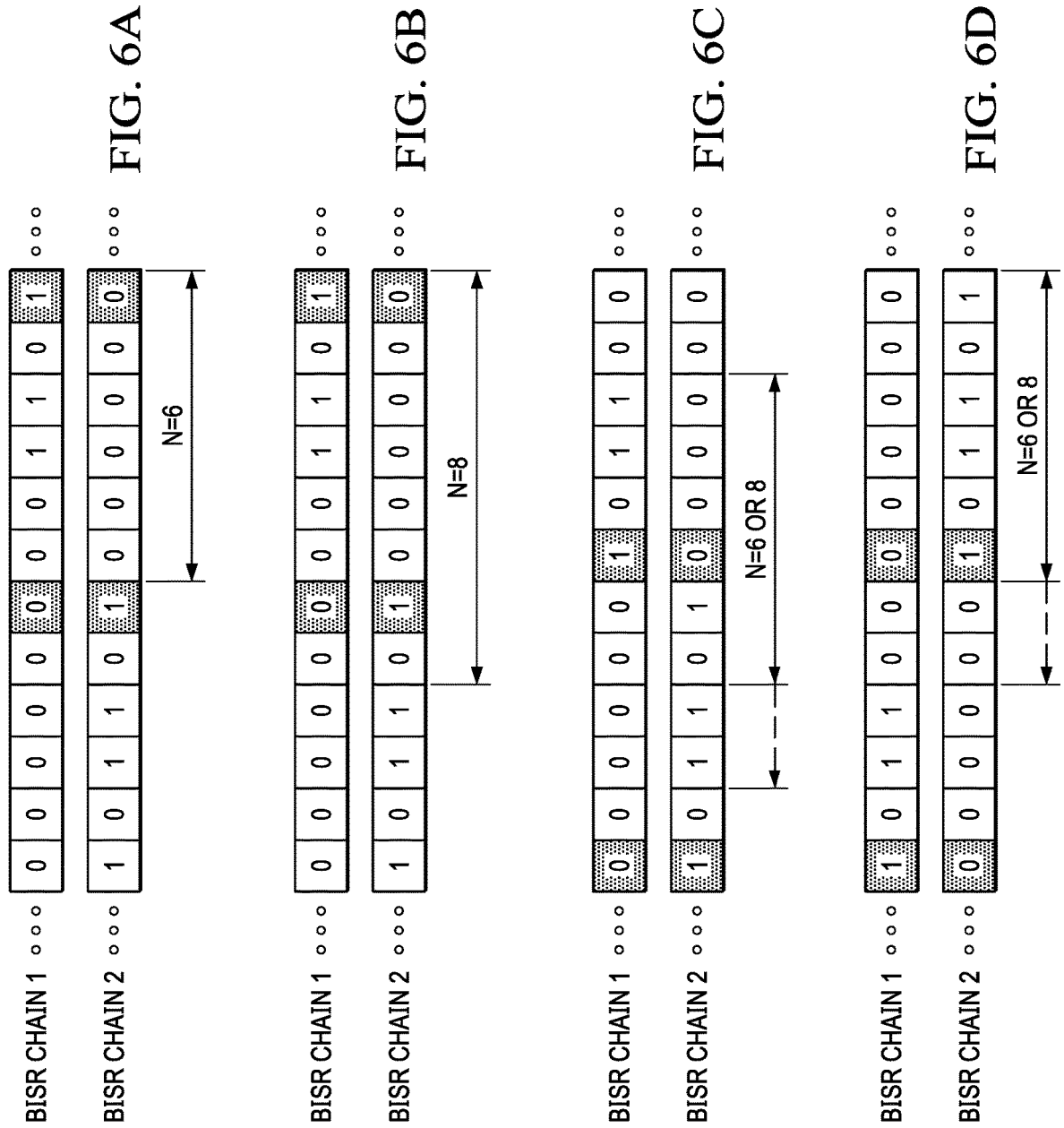

FIG. 7

METHOD AND APPARATUS FOR PROCESSING MEMORY REPAIR INFORMATION

CROSS-REFERENCE TO RELATED APPLICATION

This patent application is a National Stage of International Application No. PCT/US2019/048223, filed Aug. 27, 2019, which claims the benefit of the filing date of U.S. Provisional Patent Application 62/836,100, filed Apr. 19, 2019, which are hereby incorporated by reference.

TECHNICAL FIELD

The disclosed technology is directed techniques for circuit design, testing, and manufacture and more particularly to an innovative system for processing memory repair information of an integrated circuit with an embedded memory.

BACKGROUND OF THE DISCLOSURE

Current high-density semiconductors often include embedded memories. Built-in self-test (BIST) technologies for identifying defects and problems in the memories. Similarly, these memories can include or exploit built-in self-repair (BISR) technologies, where some or all of both the repair analysis (built-in repair analysis or BIRA) and the repair delivery are performed on the chip itself.

Such analysis and repair can be performed occasionally or each time the embedded system is started. A typical repair includes storing repair instructions and other repair information into one or more registers, then serially transferring and permanently storing this repair information using programmable fuses. One or more registers may be coupled in a BISR chain to store memory repair information and used to repair one or more bad memory cells. The BISR chain may be formed by serially connecting sequential elements in a scan chain fashion so that the required data can be shifted into sequential elements. The process of storing the repair information into the BISR chain can be time consuming and inefficient, and current techniques require a large amount of storage. Improved techniques are desirable.

SUMMARY OF THE DISCLOSURE

Various disclosed embodiments include an apparatus and method for repairing a memory. A method includes performing a repair analysis of the embedded memories to produce repair information. The method includes storing the repair information in the registers, where the registers are organized into groups comprising chains of identical length. The method includes performing collision detection between the repair information in each of the groups. The method includes merging the repair information in each of the groups. The method includes repairing the embedded memories using the merged repair information.

In various embodiments, the method is performed by an apparatus such as a computing device, a controller on a chip, or a circuitry implemented on a chip with the memory. In various embodiments, repairing the embedded memories includes storing and later broadcasting the merged repair information. In various embodiments, the repair information is stored in an embedded non-volatile memory. In various embodiments, repairing the embedded memories includes storing and later broadcasting the merged repair information, and wherein the merged repair information is compressed before being stored and decompressed before being broadcast. In various embodiments, the groups are processed serially. In various embodiments, the groups are processed in parallel. In various embodiments, the repair process is aborted when a collision is detected. In various embodiments, the collision detection includes determining whether there are identical repair words in more than one of the chains within a window defined by a repair word size. In various embodiments, a subset of chains within a group is selected for repair while others are not disturbed. Various embodiments also include modifying the repair information in a least one chain to produce the identical length.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 4A-4C illustrate examples of successful collision checks in accordance with disclosed embodiments;

FIGS. 5A-5C illustrate examples of failed collision checks in accordance with disclosed embodiments;

FIGS. 6A-6D illustrate additional examples of collision checks in accordance with disclosed embodiments;

FIG. 7 illustrates a technique for handling of chains of non-identical length in accordance with disclosed embodiments.

DETAILED DESCRIPTION

The Figures discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Conventional BIST/BISR techniques include processes to compress and store repair information of individual BISR chains. The BISR chains can later be retrieved and distributed upon power-up of the entire circuit or portions of it when the circuit is divided in power domains.

However, all these techniques require a large amount of storage. They also require a trade-off between repair time, i.e. the time required to serially load the BISR chains at power up, and complexity of the circuit reading the repair information and applying it to the chains.

Disclosed embodiments can minimize repair time by using multiple chains processed in parallel but the circuit complexity increases linearly with the number of chains. Disclosed embodiments can minimize the repair time at power up, the amount of on-chip storage for repair information, and the circuit complexity required to implement repair.

Illustrative Operating Environment

Figure 1:
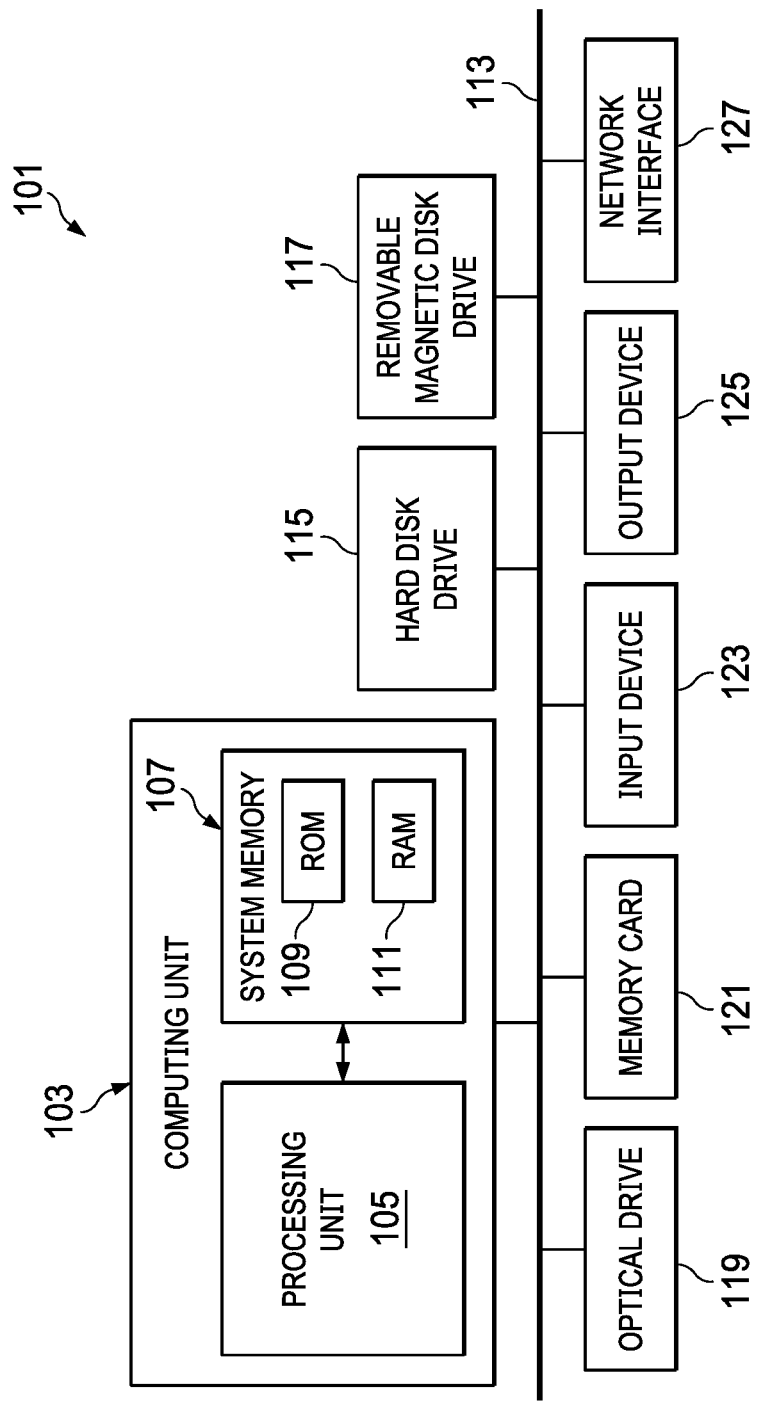
FIG. 1 illustrates components of a computing device that may be used to implement various embodiments of the disclosed technology.

Sone examples of the disclosed technology may be implemented through the execution of software instructions by a computing device, such as a programmable computer, while other embodiments are implemented in on-chip circuitry. Accordingly, FIG. 1 shows an illustrative example of a computing device 101 usable in off-chip embodiments. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RANI) 111. As will be appreciated by those of ordinary skill in the art, both the read-only memory (ROM) 109 and the random-access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multiprocessor computer, a plurality of single and/or multiprocessor computers arranged into a network, or some combination of both.

It also should be appreciated that the description of the computing device 101 illustrated in FIG. 1 is provided as an example only, and it not intended to suggest any limitation as to the scope of use or functionality of various embodiments of the invention. The computing device can be part of an ATE (Automatic Test Equipment), debug station, or similar equipment used to apply tests to an integrated circuit and analyze the test results.

Disclosed embodiments include systems, devices, and methods for parallel processing of BISR chains. The disclosed techniques can optimize handling of designs with repeated blocks, reduce time required to load BISR chains, and reduce the number of fuses required to store repair solutions or other repair information. Disclosed embodiments can be implemented for improved repair processes for any memory and is particularly useful in any circuit where BISR chains can form groups of identical length. Disclosed embodiments can be particularly useful in designs with repeated blocks but other designs can benefit by segmenting or padding chains as described herein.

These advantages are achieved in various embodiments that can calculate common repair solution for chains which can be broadcast during power up, using chains organized into groups of identical length. These techniques are particularly advantageous in designs with repeated blocks. Various embodiments can include processes such as chain length balancing in some situations and adding dummy registers to complete chains as needed.

Disclosed techniques are compatible with memories with parallel or serial repair interfaces, and parallel chains can be part of different power domains. The user can enable any subset of chains each time the BISR controller is run, and it is possible to perform hard incremental repair on selected chains while the system is running.

As described in more detail herein, various embodiments include modifying control signals to enable all chains of a parallel group at the same time, and these modifications can be applicable to an autonomous mode. Scan-in/out can be used to support parallel mode, including, in specific embodiments, broadcasting repair information to all chains and using an AND-OR structure that allow merging multiple inputs. In various embodiments, a user input can be received to select an individual chain, and the same repair solution can be broadcast to all selected chains.

Disclosed embodiments include fuse programming. This can include circuit checks for conflicts between chains, ensuring that repair words do not overlap, and if so, the BISR controller reports error an error (e.g., Go=0 at the end, as described below). Only one pointer may be used per parallel group, and it is possible to have all chains of controller part of a single parallel group sharing the same fuses. Checking can be performed during all autonomous modes, such as BIRA-to-BISR transfer, fuse programming, verification, and power up.

Figure 2A:
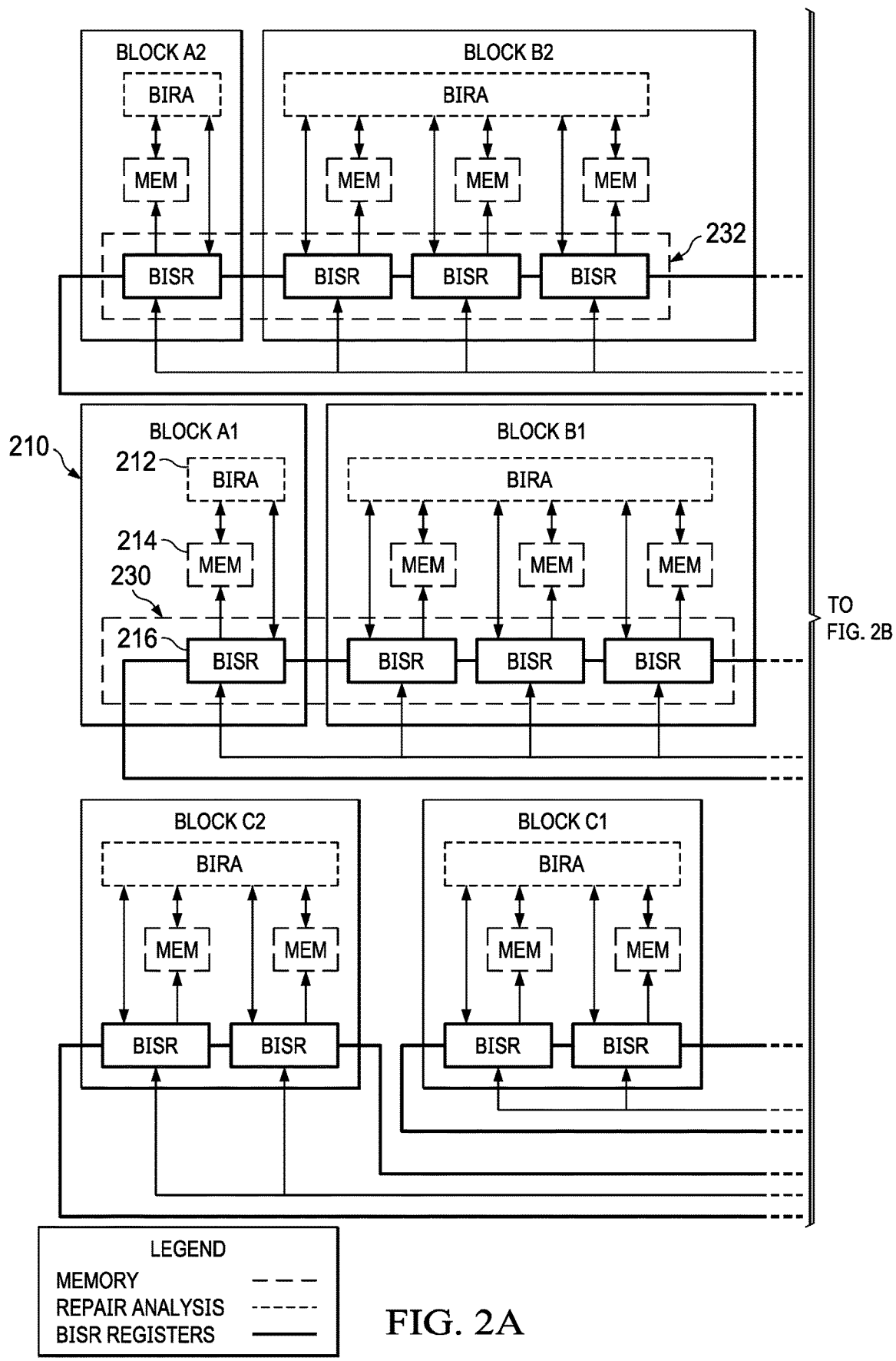
FIGS. 2A and 2B together illustrate an example of a memory repair apparatus implemented in accordance with disclosed embodiments.
Figure 2B:
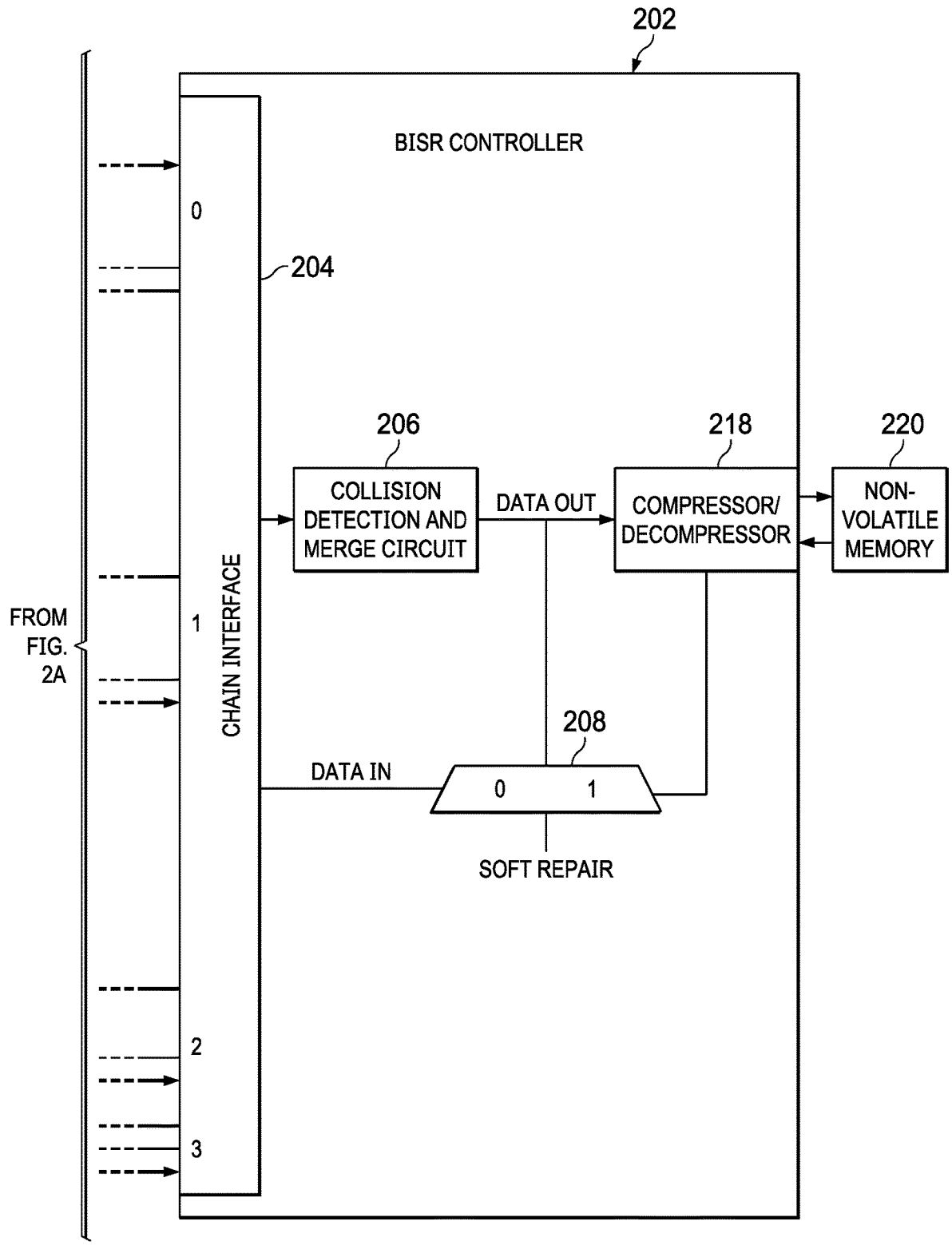

FIGS. 2A and 2B together illustrate an example of a memory repair apparatus 200 implemented in accordance with disclosed embodiments that can be performed under the control of a BISR controller 202 or a computing device 100 with relevant circuitry to repair errors in embedded memory 214. While each block 210 shows separate instances of BIRA controllers 212, embedded memories 214, and BISR chains 216, these instances are not necessarily separate elements; for example, the embedded memories 214 may each be part of the same embedded memory, and BIRA controllers 212 may all be the same controller.

Various embodiments are directed to a practical on-chip solution for memory analysis and repair. BISR controller 202 and BIRA controllers 212 can each be physically implemented by one or more controllers or control circuitry. In specific embodiments, BIRA controllers 214 can be implemented as controllers that performs repair analysis as described herein, and BISR controller 202 can manage the other functions as described below.

In other embodiments implemented as an off-chip solution under the control of computing device 100, one or more of the other functions depicted in this example can also be implemented off-chip.

Embedded memories 214, while each illustrated as a single block element here, can be each implemented as hundreds or thousands of memory blocks each equipped with spare rows and/or columns or as any combination of other physical memory circuits. The principles and operations described herein are not limited by the physical implementation of the embedded memory 216. Similarly, non-volatile memory 220 can be implemented as any programmable non-volatile storage medium, including fuses, flash memories, and others, and can be combined with any embedded memory 214.

In this example, a BIRA controller 212 performs repair analysis on embedded memory 214 to produce repair information. The repair information is stored in one or more BISR registers 216, where each chain group includes one or more BISR chains and each BISR chain comprises repair information from one or more registers. For example, as shown in FIGS. 2A-2B, the BISR registers 216 in Blocks A1 and B1 form a BISR chain 230, and the BISR registers 216 in Blocks A2 and B2 232. The A1/B1 chain 230 and the A2/B2 chain 232 form a chain group.

The repair information goes through chain interface 204 BISR controller 202. The repair information is processed by collision detection/merge circuit 206 as described herein.

If no collision in the repair information is detected by collision detection/merge circuit 206, the repair information in the scan groups is merged as disclosed herein. This can be, for example, a logical OR of all corresponding bits of the parallel chains being merged. The merged repair information can then be passed in series or in parallel to compressor/decompressor 218, to compress the repair information for storage, though compression may be omitted in some cases. In other cases, the compression and the merging are performed at the same time, so that the repair information is compressed as it is being merged. Similarly, the merging can take place during the collision checking so that the repair information is merged as the collision checking is performed.

The merged (and possibly compressed) repair information can then passed in series or in parallel to any type of non-volatile storage 220, including by programming fuses, storing in flash memory, or otherwise. The merged repair information can be read from the fuses or other non-volatile memory, decompressed, and broadcast to the chains at next power-up. At this point, this iteration of the repair of embedded memory 214 is complete.

To assign BISR chains to groups, various embodiments can use one or a combination of several options. Such an assignment can be according to automatic partitioning based on existing property used by BISR sharing, or can be according to manual partitioning, for example based on a partitioning definition file. In various embodiments, the chains can be added to a group is to ensure that each group has the same length. In some case, the system can limit the number of chains in a group if the probability of collision becomes sufficiently high to have a material impact on yield.

Collision detection/merge circuit 206 is used to determine if the repair information of parallel chains or groups is compatible. This can be active during chain rotation or fuse programming, and is particularly advantageous during rotation to avoid programming fuses. During chain rotation, the merged output can broadcast to all chains of a group at the same time that the content of the chains is analyzed for collisions. This is done by selecting the "1" input of multiplexer 208 controlled by the SoftRepair signal while clocking the chains.

Collision detection/merge circuit 206 can perform a process as follows. Collision detection/merge circuit 206 will monitor each chain group as it is received, bit by bit, in parallel. When a "1" is detected on one of the chains, collision detection/merge circuit 206 checks that all other chains only contain zeroes in the window defined by the repair word size (N), including the initial 1. The 1 on any chain defines the window determined by the repair word size. Generally. if this is not true—if there is a "1" in the window in multiple different chain groups—a collision is detected and the merge (and compress) is a failure. In general, collisions may be only checked between chains of a same group. In specific, non-limiting implementations, groups are processed sequentially to reduce the amount of logic and size of the non-volatile memory (e.g. number of fuses), but, in other implementations, the groups can be processed in parallel.

However, in particular cases, two or more chains of a group may have a 1 in the first bit of window. In such cases, collision detection/merge circuit 206 can check that all N bits in the window are identical across all chains, which is necessary for incremental repair and if collision detection 206 is enabled after a chain rotation.

Disclosed embodiments are particularly applicable to integrated circuits containing identical blocks, where each block can contain one or more BISR chains. A method as disclosed herein is particularly useful when there is a small number of memories need to be repaired, and it is acceptable to repair memories which don't need to be immediately repaired. In such cases, the system can effectively connect block chains in a way to form groups of parallel chains connected to a BISR controller. The chains of a group preferably have the same length, and the repair information of all chains of a group can be merged and compressed before being stored in non-volatile memory (e.g., a fuse array). The collision detector reports a failure if the repair information from parallel chains is incompatible and can't be merged. Repair information can be de-compressed and broadcast to all chains of a group upon power up. In various embodiments, it is possible to only load some of the chains if those belong to different power domains.

Figure 3:
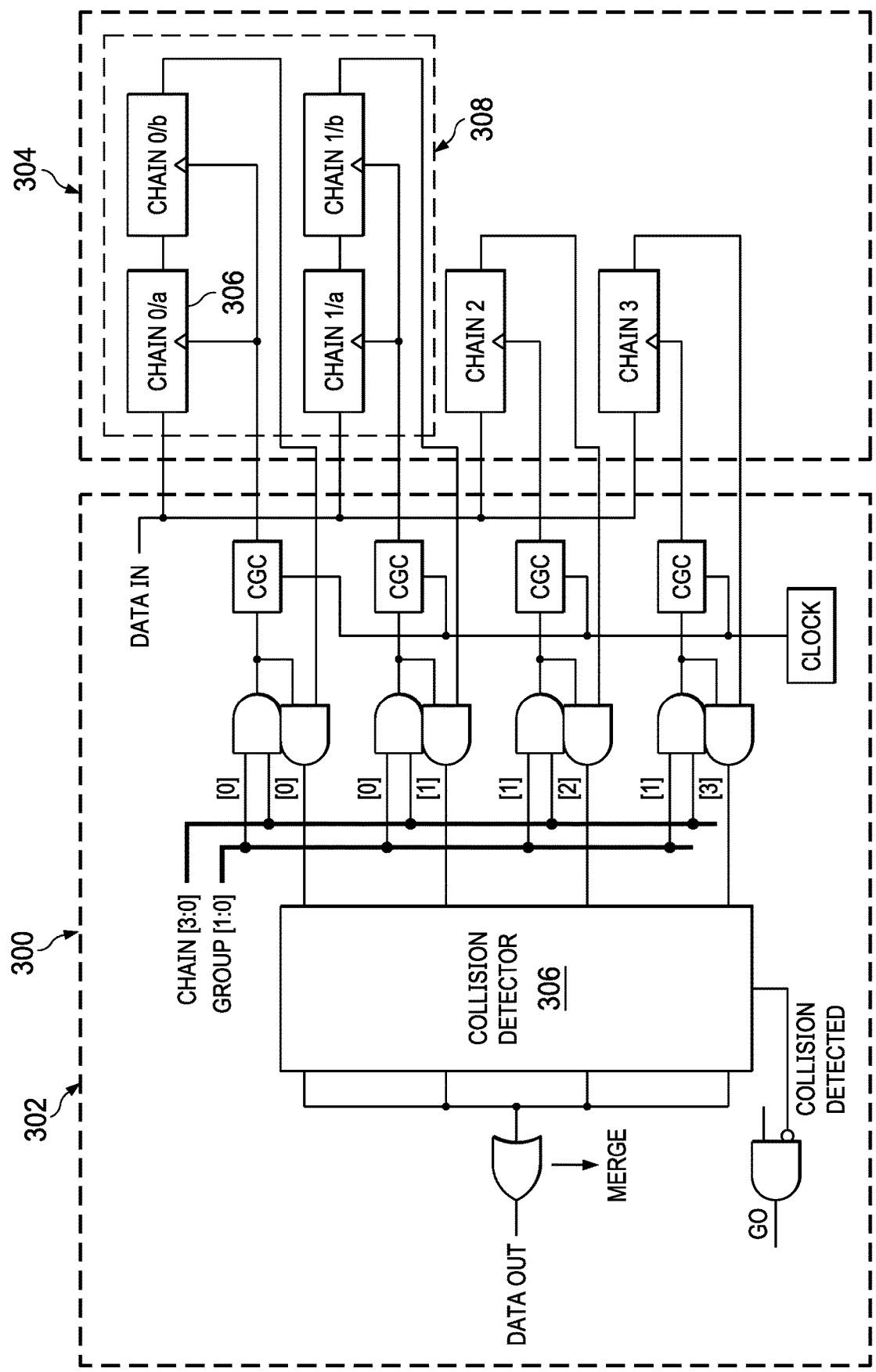
FIG. 3 illustrates an example configuration of an apparatus for processing memory repair information of circuits in accordance with disclosed embodiments.

FIG. 3 illustrates an example configuration of an apparatus 300 for processing memory repair information of circuits as described herein. This figure illustrates a BISR controller portion 302 and a set of chains 304. Each chain 306 in 304 represents one or more BISR registers. The chains 304 can be loaded by the Data In line. In this example, there are four chains organized into two groups which share a common collision detector 306. As illustrated, the chains 304 are grouped to form equally-sized groups; e.g., Chain 0/a combined with Chain 0/b is the same size as Chain 1/a combined with Chain 1/b (group 0, illustrated as group 308) and Chain 2 is the same size as Chain 3 (Group 1). A chain receives clock pulses if the control input of the clock gating cell (CGC) driving it is set to a logic 1.

Since, in this example, the four chains are organized into two groups which share a common collision detector, only one group can be selected at any one time. Signal Group[1:0] selects a group. Chains 0 and 1 are part of group 0 whereas chain 2 and 3 are part of group 1. Signal Chain[3:0] selects chains. A chain only receives clock pulses if both its group and chain number is selected. For example, chain 2 becomes active if Group[1] and Chain[2] are set to logic 1. The Chain[3:0] input allows to select a subset of a group. This is useful when chains of a same group are part of different power domains. These chains might be powered up at different times. The output of a chain contributes to the input of the collision detector if it is active. Otherwise, the corresponding input of the collision detector is set to logic 0. The collision detector receives inputs from the selected chains and sets its CollisionDetected output to 1 which in turn will set the BISR controller output to 0 indicating a failure of the operation. The bit streams of the selected chains are ORed together to obtain the merged repair solution on DataOut.

As illustrated in FIGS. 2 and 3, in these examples, repair (BISR) registers are organized into groups of parallel chains, where the groups preferably have identical length, connected to a BISR controller. Long chains can be broken into smaller segments and padded, if necessary to achieve the desired length, and several integrated circuits can contain repeated instances of blocks. The system can broadcast repair information as long as no conflict/collision is detected. The collision detection process is helpful to save test time and the early detection of conflicts between chains prevents lengthy fuse programming and post-repair re-test.

In FIGS. 4-6, below, the three chains CHAIN0 to CHAIN2 are shifted from left to right into the collision detector. When a 1 is detected on any of the chains, it indicates the beginning of a repair word highlighted in orange. The repair word size is chosen as described herein.

Figures 4A, 4B, 4C:
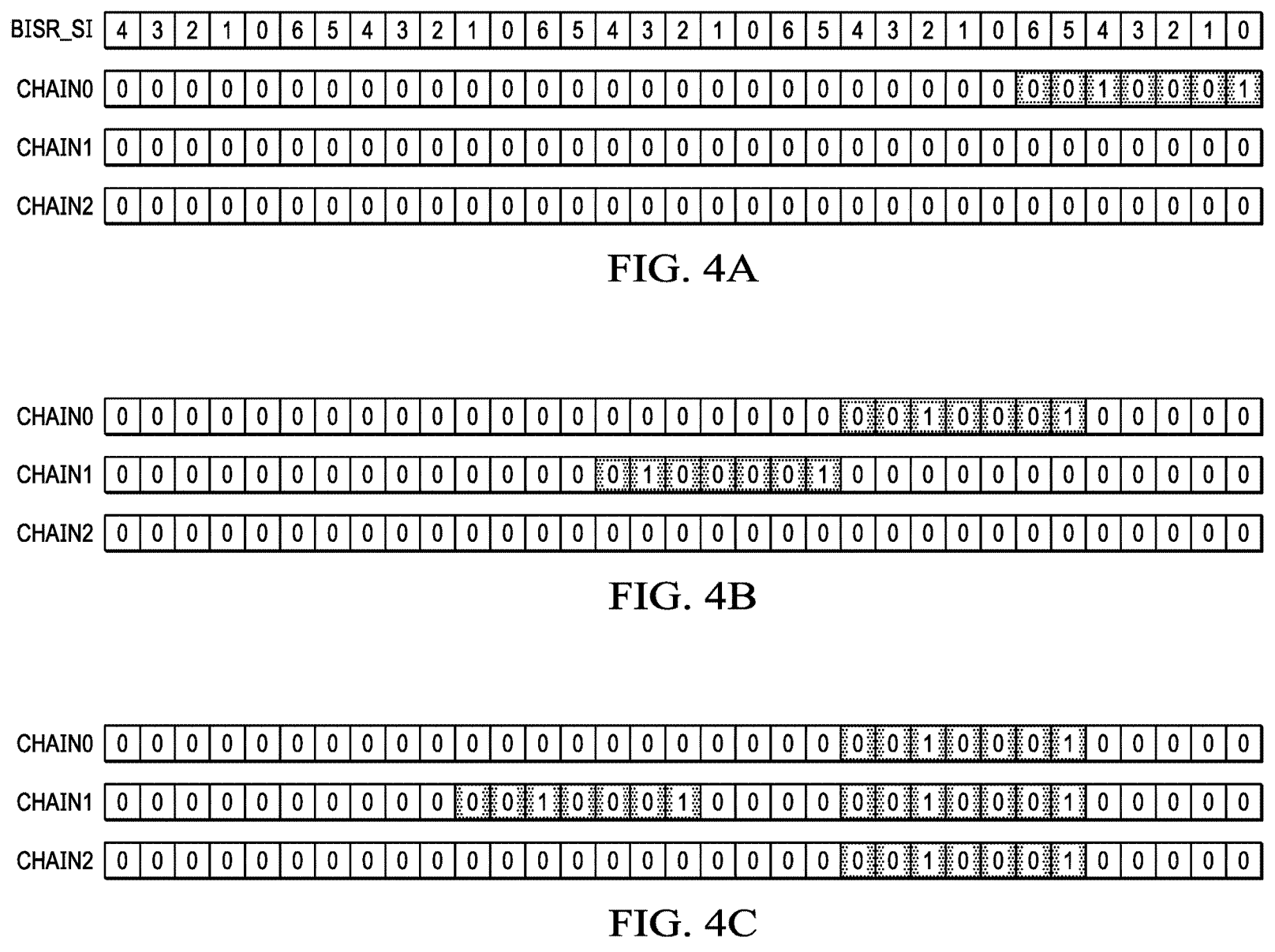

FIGS. 4A-4C illustrate examples of successful collision checks by collision detection 206 (meaning that no collisions are detected). In each of these examples, all BISR registers have seven bits, but of course this length may differ in other implementations. In various embodiments, BISR registers are not required to be of the same length. When the length is variable, the repair word size can correspond to the maximum BISR register length, the average BISR register length, or any other size appropriate for optimum compression of the repair information.

FIG. 4A illustrates an example where only one chain—CHAIN0—has repair information, illustrated as a highlighted repair word starting with a "1" including 1s and 0s. There is no collision since there is only repair information in the single chain.

FIG. 4B illustrates an example where only two chains—CHAIN0 and CHAIN1—have repair information, illustrated as a highlighted repair word starting with a "1" including 1s and 0s. There is no collision since the repair information for different chains do not overlap.

Figures 5A, 5B, 5C:
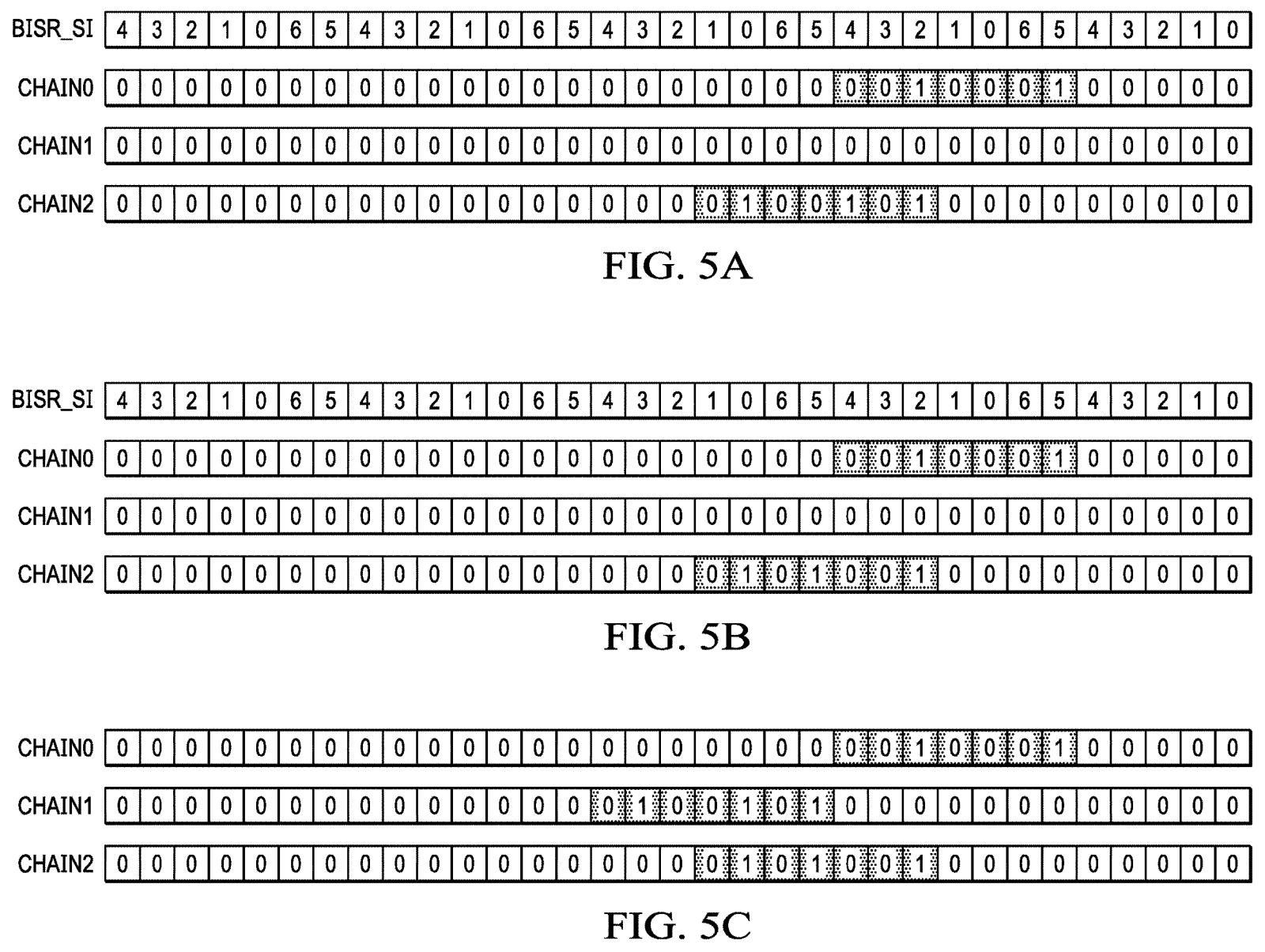

FIG. 4C illustrates an example where all three chains have repair information, illustrated as a highlighted repair word starting with a "1" including 1s and 0s. There is no collision in this incremental repair case since the repair information for different chains do not overlap at all or overlap with exactly the same data. In this example, in a first repair session or process, only one of the three chains, such as CHAIN0, required repair. After merging of the repair solutions, all three chains were repaired in the same way even if not necessary for CHAIN1 and CHAIN2. FIG. 5C shows the content of the chains after repair analysis during the second repair session but before merging of the repair solutions.

FIGS. 5A-5C illustrate examples of failed collision checks by collision detection 206 (meaning that collisions are detected and so the compress/merge cannot be performed). In each of these examples, all BISR registers have seven bits, but of course this length may differ in other implementations.

FIG. 5A illustrates an example where only two chains—CHAIN0 and CHAIN2—have repair information, illustrated as a highlighted repair word starting with a "1" including 1s and 0s. There is a collision since there is a partial overlap of the repair words and since the repair information in the repair words does not match.

FIG. 5B illustrates an example where only two chains—CHAIN0 and CHAIN2—have repair information, illustrated as a highlighted repair word starting with a "1" including 1s and 0s. While there is no mismatch of repair data in the overlapping portion of the repair words, there is a collision since the repair words are misaligned.

FIG. 5C illustrates an example where all three chains have repair information, illustrated as a highlighted repair word starting with a "1" including 1s and 0s. There is a collision since there is only a partial overlap of the repair words. Moreover, in such a case, the complexity increases significantly, and it can be difficult to keep track of repair word window of individual chains. Further, there may be inaccuracy due to the word size being same for all memories.

FIGS. 6A-6D illustrate additional examples of collision checks. As illustrated in FIGS. 6A-6D, a BISR register is typically (but not always) composed of a repair enable bit and the remaining bits are the repair address of the row or column to replace in a memory. The highlighted bits indicate the location of the repair enable. All BISR registers in the portion of the chains shown are of the same length (6) but other BISR registers might be of different length. This is why, in this example, the repair word size indicated is 6 or 8.

In FIG. 6A, there is no collision. The repair word size is N=6, and the repair enable is closer to the chain output. Note that because the repair word size is 6, there is no overlapping inconsistent repair information—the repair words for each chain corresponds to only zeros in the other chain.

In FIG. 6B, there is a collision. The repair word size is N=8, and the repair enable is closer to the chain output. Note that because the repair word size is 8, although the data is the same as in FIG. 7A, there is overlapping inconsistent repair information within the repair word.

In FIG. 6C, there is a collision. The repair word size can be N=6 or N=8, and the repair enable is closer to the chain input. Whether the repair word size is 6 or 8, there is overlapping inconsistent repair information within the repair word (where the repair word window starts from the first "1").

In FIG. 6D, there is no collision. The repair word size can be N=6 or N=8, and the repair enable is closer to the chain input. Whether the repair word size is 6 or 8, there is no overlapping inconsistent repair information within the repair word (where the repair word window starts from the first "1").

Figure 7:
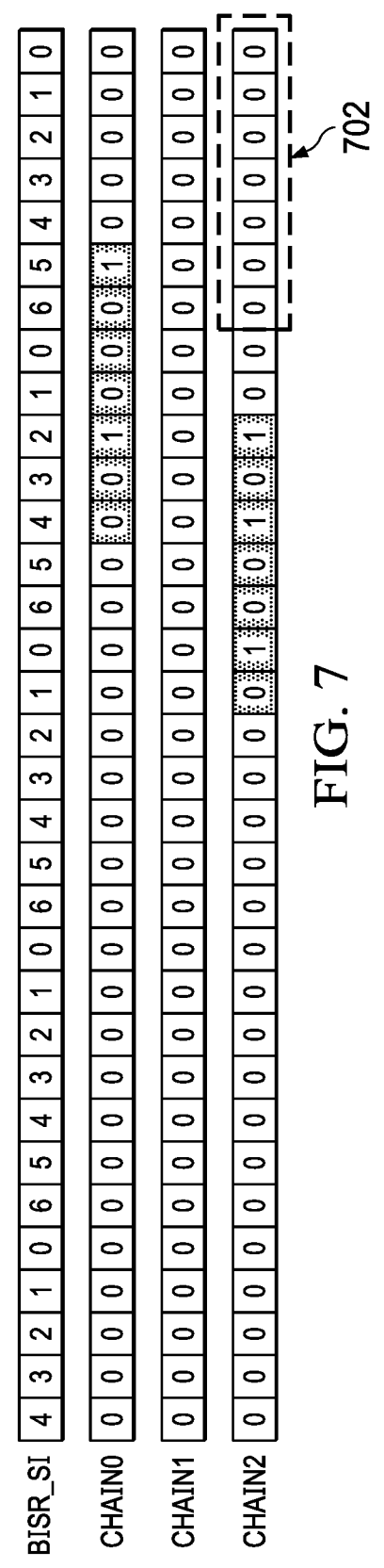

FIG. 7 illustrates one technique for handling of chains of non-identical length in accordance with disclosed embodiments. In this example, all BISR registers have 7 bits. As illustrated here, Chain2 is shorter than Chain0 and Chain1. This issue can be addressed in a number of ways, both referred to herein as "modifying the repair information" in a least one chain to produce the identical length. One way to perform this modification is to add BISR registers to Chain2 make its length identical to other chains.

Another way to perform this modification is to delay clocking of the shorter chain Chain2 and assume a value of 0 for missing bits when performing collision detection, effectively "padding" 0 values onto the initial portion of the Chain2 when performing collision checking and merging, as illustrated at 802. The merged solution has as many bits as the longest chain(s) and shorter chain(s) can then be over-shifted when loading the repair solution back into the chains.

Figure 8:
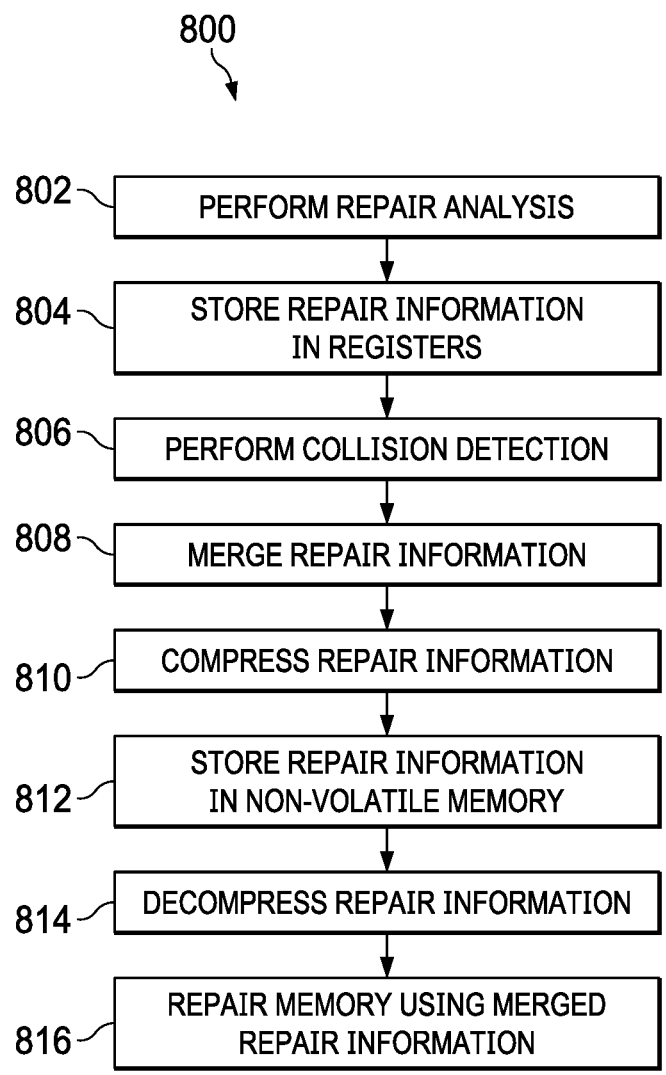
FIG. 8 illustrates a process in accordance with disclosed embodiments.

FIG. 8 illustrates a process 800 in accordance with disclosed embodiments, that can be performed, for example, by an apparatus such as a computing device as disclosed herein, a controller on a chip, or circuitry such as an application-specific integrated circuit implemented on a chip with an embedded memory, or by another circuit or processor, all referred to generically as the "system" below. In general, such an apparatus can have a controller and a plurality of embedded memories connected to be accessed by the controller and coupled to registers capable of storing repair information.

The system can perform a repair analysis of the embedded memories to produce repair information (802). The repair information can initially be stored in a plurality of registers.

The system can store the repair information in the registers, wherein the registers are organized into groups comprising chains of identical length (804). In some cases, a subset of chains within a group can be selected for repair while others are not disturbed.

The system can perform collision detection between the repair information in each of the groups (806). If a collision is detected, the process can abort. The collision detection can include determining whether there are identical repair words in more than one of the chains within a window defined by a repair word size When no collision is detected by the collision detection, the system can merge the repair information in each of the groups (808). The merge process can be performed while performing collision detection.

The system can also compress the repair information (810), after or while the merge process is performed.

The system can store the repair information in non-volatile memory (812).

The merged repair information, if compressed at 810, can be decompressed (814) before being broadcast or otherwise processed.

The system can repair the embedded memories using the merged repair information (816). Repairing the embedded memories can include storing at 812 and later broadcasting the merged repair information.

In various implementations, the groups can be processed serially or the groups can be processed in parallel. In some embodiments, the repair information may be modified in a least one chain to produce the identical length.

Various embodiments can limit the compression/processing according to specific rules. Examples of such rules include requiring that chains of a same group have the same length, or that requiring that all segments of a chain be part of the same power domain.

Similarly, permissions can be used to define specific features. Examples of such permissions include that chains can include any number of segments, that chains of a group can be composed of different types of segments, and that there is no need for identical modules/blocks in a particular process. For example, in a system with four chains in two groups, one group (Group[0]) can be defined as including two chains (Chain[1:0]) and a second group (Group[1]) can be defined as including the remaining two chains (Chain[3:2]).

In various embodiments, it is possible to repair some chains while the system is running by performing an in-system incremental repair. In these cases, the chains of a first group are completely repaired on a first pass through a process, then the remaining chains or groups can be repaired using a new solution on a subsequent pass. In cases where only one chain is to be repaired, a single group can be defined that balances the length of all chains, where a custom BISR register can be used for padding if required.

Disclosed herein are example embodiments of methods, apparatus, and systems for BISR. The disclosed methods, apparatus, and systems should not be construed as limiting in any way. Instead, the present disclosure is directed toward all novel and nonobvious features and aspects of the various disclosed embodiments, alone and in various combinations and sub-combinations with one another. Furthermore, any features or aspects of the disclosed embodiments can be used in various combinations and sub-combinations with one another or with other methods, apparatus, and systems. The disclosed methods, apparatus, and systems are not limited to any specific aspect or feature or combination thereof, nor do the disclosed embodiments require that any one or more specific advantages be present or problems be solved.

U.S. Pat. Nos. 10,134,483, 10,014,074, 9,852,810, 9,799,413, 8,775,880, 7,757,135, 8,295,108, 7,898,882, 7,415,640, and 7,149,924 describe other BISR-related issues, and are hereby incorporated by reference.

Among the embodiments disclosed herein is a process for repair information storage in BISR processes. Disclosed techniques provide a significant improvement by reducing the required storage area for repair information, reducing repair time, and reducing circuit complexity.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. The various elements, steps, and processes disclosed herein may be combined, in whole or in part, in any number of ways within the scope of the disclosure.

Additionally, the description sometimes uses terms like "compress" to describe the disclosed methods. These terms are high-level abstractions of the actual operations that are performed. The actual operations that correspond to these terms may vary depending on the particular implementation and are readily discernible by one of ordinary skill in the art.

Embodiments of the disclosed technology can be performed or created by computer-executable instructions stored on one or more computer-readable media (e.g., tangible non-transitory computer-readable media such as one or more optical media discs, volatile memory or storage components (such as DRAM or SRAM), or nonvolatile memory or storage components (such as hard drives)) and executed on a computer. Such embodiments can be implemented, for example, as an electronic-design-automation (EDA) software tool (e.g., an automatic test pattern generation (ATPG) tool). The computer-executable instructions can be part of, for example, a dedicated software application or a software application that is accessed or downloaded via a web browser or other software application (such as a remote computing application). Such software can be executed, for example, on a single local computer or in a network environment (e.g., via the Internet, a wide-area network, a local-area network, a client-server network (such as a cloud computing network), or other such network) using one or more network computers. For clarity, only certain selected aspects of the software-based implementations are described. Other details that are well known in the art are omitted. For example, it should be understood that the disclosed technology is not limited to any specific computer language, software tool, or computer. Any of the disclosed methods can alternatively be implemented (partially or completely) in hardware (e.g., an ASIC, PLD, or SoC). In various embodiments, one or more process steps can be implemented on an ATE or debug station connected to an electronic circuit as described herein, such as an ASIC, PLD, SoC.

Additionally, any circuit description or design file describing any of the disclosed apparatus or any data structure, data file, intermediate result, or final result created or modified using any of the disclosed methods can be stored on one or more computer-readable storage medium (e.g., tangible non-transitory computer-readable media, such as one or more optical media discs, volatile memory or storage components (such as DRAM or SRAM), or nonvolatile memory or storage components (such as hard drives)).

Furthermore, any of the software-based embodiments (comprising, for example, computer-executable instructions which when executed by a computer cause the computer to perform any of the disclosed methods or to create design data for any of the disclosed apparatus) can be transmitted, received, or accessed through a suitable communication means. For example, a server computer can transmit to a client computer the computer-executable instructions for performing any of the disclosed methods or for creating design data for any of the disclosed apparatus (e.g., after the server receives a request from the client computer to download the computer-executable instructions).

Similarly, any circuit description, design file, data structure, data file, intermediate result, or final result created or modified using any of the disclosed methods or describing any of the disclosed apparatus can be transmitted, received, or accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means. Such communication means can be, for example, part of a shared or private network.

Additionally, any circuit description, design file, data structure, data file, intermediate result, or final result produced by any of the disclosed methods or describing any of the disclosed apparatus can be displayed to a user using a suitable display device (e.g., a computer monitor, touch screen, or other such display device). Such displaying can be performed as part of a computer-implemented method of performing any of the disclosed methods.

The disclosed methods or apparatus can be used or implemented at one or more stages of an overall design flow. Circuits manufactured using designs created or tested using embodiments of the disclosed technology are also considered to be within the scope of this disclosure. For example, a circuit design describing any of the disclosed testing environments can be fabricated into an integrated circuit using known microlithography techniques.

Any of the disclosed methods or apparatus can be performed or designed in an EDA environment. For presentation purposes, however, the present disclosure may sometime refer to a circuit-under-test (including the various components of the circuit-under-test) and the associated testing hardware (including the various components of the hardware) by their physical counterparts (for example, scan chains, scan cells, ring generators, phase shifters, shadow registers, control gaters, and other such terms). It should be understood, however, that any such reference not only includes the physical components but also includes representations of such components stored on non-transitory computer-readable media as are used in simulation, automatic test pattern generation, or other such EDA environments. For example, any of the disclosed apparatus can be described or represented as design data or design information stored on one or more computer-readable media. More specifically, any of the disclosed testing apparatus can be described or represented in an HDL file (such as a Verilog, VHDL, or register-transfer level file), a gate-level netlist, or other such EDA design file (e.g., a GDSII file or Oasis file). Such design data or design information can be created using an appropriate EDA software tool.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of the data processing system may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form. Having illustrated and described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the disclosed technology. Rather, the disclosed technology includes all novel and nonobvious features and aspects of the various disclosed apparatus, methods, systems, and equivalents thereof, alone and in various combinations and subcombinations with one another.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle. The use of terms such as (but not limited to) "mechanism," "module," "device," "unit," "component," "element," "member," "apparatus," "machine," "system," "processor," or "controller," within a claim is understood and intended to refer to structures known to those skilled in the relevant art, as further modified or enhanced by the features of the claims themselves, and is not intended to invoke 35 U.S.C. § 112(f).

What is claimed is:

1. A method comprising:
   performing a repair analysis of the embedded memories to produce repair information;
   storing the repair information in multiple register chains, each register chain including a plurality of registers, wherein the register chains are organized into groups comprising chains of identical length;
   for each of the groups of the register chains, performing collision detection between the repair information stored in the register chains;
   merging the repair information stored in the register chains when the collision detection indicates no collision between the repair information stored in the different register chains in each of the groups; and
   repairing the embedded memories using the merged repair information.

2. The method of claim 1, wherein repairing the embedded memories includes storing and later broadcasting the merged repair information.

3. The method of claim 1, wherein the merged repair information is stored in an embedded non-volatile memory.

4. The method of claim 1, wherein repairing the embedded memories includes storing and later broadcasting the merged repair information, and wherein the merged repair information is compressed before being stored and decompressed before being broadcast.

5. The method of claim 1, wherein the groups are processed serially or the groups are processed in parallel.

6. The method of claim 1, wherein the repair information is merged during the collision checking.

7. The method of claim 1, wherein the repair process is aborted when a collision is detected.

8. The method of claim 1, wherein the collision detection includes determining whether there are identical repair words in more than one of the chains within a window defined by a repair word size.

9. The method of claim 1, wherein a subset of chains within a group is selected for repair while others are not disturbed.

10. The method of claim 1, further comprising modifying the repair information in a least one chain to produce the identical length.

11. An apparatus, comprising:
    a controller; and
    a plurality of embedded memories connected to be accessed by the controller and coupled to register chains, each including a plurality of registers capable of storing repair information, the apparatus configured to:
    perform a repair analysis of the embedded memories to produce repair information;
    store the repair information in the register chains, wherein the register chains are organized into groups comprising chains of identical length;
    for each of the groups of the register chains, perform collision detection between the repair information stored in the register chains;
    merge the repair information stored in the register chains when the collision detection indicates no collision between the repair information stored in the different register chains in each of the groups; and
    repair the embedded memories using the merged repair information.

12. The apparatus of claim 11, wherein repairing the embedded memories includes storing and later broadcasting the merged repair information.

13. The apparatus of claim 11, wherein the merged repair information is stored in an embedded non-volatile memory.

14. The apparatus of claim 11, wherein repairing the embedded memories includes storing and later broadcasting the merged repair information, and wherein the merged repair information is compressed before being stored and decompressed before being broadcast.

15. The apparatus of claim 11, wherein the groups are processed serially or the groups are processed in parallel.

16. The apparatus of claim 11, wherein the repair information is merged during the collision checking.

17. The apparatus of claim 11, wherein the repair process is aborted when a collision is detected.

18. The apparatus of claim 11, wherein the collision detection includes determining whether there are identical repair words in more than one of the chains within a window defined by a repair word size.

19. The apparatus of claim 11, wherein a subset of chains within a group is selected for repair while others are not disturbed.

20. The apparatus of claim 11, wherein the apparatus is further configured to modify the repair information in a least one chain to produce the identical length.

\* \* \* \* \*